United States Patent [19]

Komeda et al.

[11] Patent Number: 4,910,575

[45] Date of Patent: Mar. 20, 1990

[54] SEMICONDUCTOR INTEGRATED CIRCUIT AND ITS MANUFACTURING METHOD

[75] Inventors: Tadao Komeda, Ikoma; Kazuya Kikuchi, Hirakata; Hiroyuki Sakai, Neyagawa, all of Japan

[73] Assignee: Matsushita Electric Industrial Co., Ltd., Osaka, Japan

[21] Appl. No.: 396,791

[22] Filed: Aug. 21, 1989

Related U.S. Application Data

[63] Continuation of Ser. No. 61,265, Jun. 12, 1987, abandoned.

[30] Foreign Application Priority Data

Jun. 16, 1986 [JP] Japan .................................. 61-139530
Sep. 25, 1986 [JP] Japan .................................. 61-226696

[51] Int. Cl.$^4$ ..................... H01L 27/12; H01L 29/06; H01L 27/04; H01L 29/72
[52] U.S. Cl. ............................... 357/49; 357/55; 357/50; 357/34
[58] Field of Search .................. 357/55, 50, 49, 36, 357/49

[56] References Cited

U.S. PATENT DOCUMENTS

| | | | |
|---|---|---|---|
| 3,703,420 | 11/1972 | Vora | 357/35 |
| 3,762,966 | 10/1973 | Engeler et al. | 357/36 |
| 4,139,442 | 2/1979 | Bondur et al. | 357/50 |
| 4,160,991 | 7/1979 | Anantha et al. | 357/59 H |
| 4,339,767 | 7/1982 | Horng et al. | 357/49 |
| 4,419,150 | 12/1983 | Soclof | 357/35 |
| 4,484,211 | 11/1984 | Takemoto et al. | 357/50 |
| 4,660,068 | 4/1987 | Sakuma | 357/49 |
| 4,733,287 | 3/1988 | Bower | 357/55 |
| 4,819,054 | 4/1989 | Kawaji et al. | 357/49 |

Primary Examiner—Rolf Hille
Assistant Examiner—Robert P. Limanek
Attorney, Agent, or Firm—Wenderoth, Lind & Ponack

[57] ABSTRACT

A semiconductor integrated circuit device includes first and second grooves extending in a silicon semiconductor substrate, a shallow groove extending between the first and second grooves and contiguous with the first and second grooves, and insulating material occupying the first and second deep grooves and said shallow groove. Accordingly, by forming grooves having two different depths, the deep groove can be filled without increasing the thickness of the insulating layer, and moreoever, an insulating isolation region having a flat upper surface can be obtained.

5 Claims, 10 Drawing Sheets

SEMICONDUCTOR INTEGRATED CIRCUIT AND ITS MANUFACTURING METHOD

This application is a continuation of now abandoned application Ser. No. 061,265, filed on June 12, 1987.

BACKGROUND OF THE INVENTION

This invention relates to a semiconductor integrated circuit and a manufacturing method thereof wherein an insulating isolation region has a high density and a small parasitic capacitance can be obtained.

Conventional insulating isolation region-forming methods in which grooves filled with CVD $SiO_2$ are utilized have been proposed. A typical manufacturing process for a bipolar LSI using the above mentioned method are illustrated in FIGS. 6A–6F inclusive.

The process begins with the formation of an n+ type buried region 2 by diffusing arsenic over a depth of 1 micron in a p-type silicon substrate 1, and is followed by the formation of an n-type epitaxial layer 3 having a thickness of 1 micron. Then, an $SiO_2$ layer 4 having a thickness of 1.2 microns is formed by a CVD method and portions thereof are removed from the isolation region by means of photolithographic techniques (FIG. 6A).

The Si portion exposed by performing the abovementioned steps is etched off by utilizing the CVD $SiO_2$ layer as an etching mask to form a groove 5 having a depth of 2.5–3.5 microns and a width of 1.2 microns. Then, a boron ion implantation process is carried out to form a channel stopper region 6 on the bottom of said groove by using the CVD $SiO_2$ layer 4 as a mask (FIG. 6B).

An $SiO_2$ layer 7 having a thickness of 1.4 microns is deposited at 800° C. by means of a thermal decomposition method employing $SiH_2Cl_2$ and $N_2O$ gases to fill the groove 5 with the $SiO_2$ layer 7 (FIG. 6C). A photoresist layer is then formed on the substrate and which is later removed by means of a dry etching process except at the indented regions on which the photoresist layer is left at 8 to form a flat upper surface (FIG. 6D).

The photoresist 8 and $SiO_2$ 7 layers are then removed to leave flat surfaces of the isolation $SiO_2$ layer 7 and the epitaxial layer 3 (FIG. 6E). A field $SiO_2$ layer 9 having a thickness of 0.6 micron, n+ type collector region 10, p+ type base region 11, and n+type emitter region 12 are formed by performing a selective oxidation method. In this case, referring to FIG. 6F, an indented region 13 is formed due to the higher etching speed at which the $SiO_2$ layer 7 occupying the groove 5 is etched by hydrofluoric acid.

In the above-mentioned process, when the groove 5 is occupied by the $SiO_2$ layer 7 as shown by FIG. 7A, a region 15 in the $Si_2$ layer 7 where the etching speed by hydrofluoric acid is higher is formed if the ratio of the groove depth d and its width w, or d/w, exceeds 2 to 1. Therefore, an indented region 16 is formed on the isolation region during the transistor forming processes after the flat surface is provided, and because of this, the formation of a precise pattern thereon cannot be carried out.

Furthermore, if a wider isolation groove is made, since the thickness of the $SiO_2$ layer 7 corresponds to the depth of the groove, the deposition of the $SiO_2$ layer and the provision of the flat upper surface is troublesome.

And, when the field $SiO_2$ layer 7 is formed with a selective oxidation process, the substrate has to be heated and because of this, the arsenic in the n+ type buried region 2 could diffuse into the epitaxial layer 3, and the boron in the p+ type channel stopper region 6 could diffuse to bring the n+ buried region 2 close to the channel stopper region 6 thereby increasing the capacitance between the collector and the substrate.

Furthermore, when voltage is applied between the transistor collectors 10, the isolation depth has to be relatively deep in order to prevent the contact of the depletion layer with the collector region 10. If a wider isolation groove is provided, the depth may be made shallower, but this requires the provision of a thicker $SiO_2$ layer 7.

Finally, after the isolation region-forming process is performed, even if the surfaces of the $SiO_2$ layer 7 and the silicon substrate are flat, an entire layer of the $SiO_2$ layer 7 is etched off to expose the silicon substrate at the side wall of isolation region as shown at 1a in FIG. 7B, and due to this, the transistor characteristics may be degenerated.

SUMMARY OF THE INVENTION

It is the primary object of the present invention to provide a novel manufacturing method in which a thick insulating layer can be formed in isolation grooves having portions with different depths which are formed on a semiconductor substrate without bringing the substrate to an excessively elevated temperature and without requiring additional steps.

A further object of this invention is to provide a manufacturing method in which the isolation grooves provided on said substrate can be filled with an insulating layer having a thickness that is less than the depth of said isolation groove, and without forming any indented region on the surface of the isolation region.

Still, a further object of this invention is to offer a manufacturing method in which the side-wall of the region wherein the semiconductor elements are formed is not exposed, and thus the degradation of said elements can be prevented.

The foregoing objects are accomplished by the following means.

First and second deep grooves having desired depths are formed by an etching process at a specific location on a semiconductor substrate, and a groove having a shallower depth than the aforementioned first and second deep grooves are provided between and contiguous with said first and second deep grooves, and these deep and shallow grooves are filled with an insulating material for forming the insulating isolation region.

The foregoing objects can also be accomplished by performing the following steps:

a step in which the first and the second grooves each having a desired depth are formed by an etching process, a step in which portions of the semiconductor substrate located between the first and the second grooves and defining the bottom of said first and second grooves are simultaneously etched off until a shallow and third and fourth deep grooves are formed, a step in which a layer having an impurity that is the same conduction type as the semiconductor substrate is introduced onto the regions defining the bottom said shallow and deep grooves to form diffusion layers thereon, a step in which an oxide layer is formed by selectively oxidizing the surfaces defining said shallow and deep grooves by utilizing an anti-oxidation layer as a mask, a step in which an insulating layer that is thicker than the depth of said shallow groove is formed on said semiconductor substrate, a step in which said insulating layer is selectively etched off to level the anti-oxidation layer and said insulating layer which occupies said grooves, and a step in which said anti-oxidation layer is removed to make the height of the exposed surface of said oxide layer higher than the height of the exposed surface of said semiconductor substrate.

According to the present invention as described herein, the following benefits, among others, are obtained.

(1) An insulating isolation layer having a nearly flat surface can easily be formed.

(2) Furthermore, a thick insulating layer can be formed without bringing the semiconductor substrate to an elevated temperature.

(3) Thus, the parasitic capacitances associated therewith can be minimized, and higher precision patterning can be achieved, and thus, a semiconductor device with lower power consumption and higher packing density can be provided according to the present invention.

While the novel features of this invention are set forth in the appended claims, the invention, both as to organization and content, will be better understood and appreciated, along with other objects and features thereof, from the following detailed description taken in conjunction with the drawings.

DETAILED DESCRIPTION OF THE PREFERRED EMBODIMENTS

Referring to FIGS. 1A to 1G, the present invention is embodied in a manufacturing process of a bi-polar LSI. The process is started with the formation of a n+ type region 31 having a depth of 1 micron by performing a selective diffusion method in which arsenic diffuses the transistor formation region of a p-type silicon substrate 30 having a resistance of 10 to 20 Ohms/cm and this is followed by the formation of an n-type epitaxial layer 32 having a resistance of 0.6 Ohms/cm and a thickness of 1 micron, and the formation of an $SiO_2$ layer 33 having a thickness of 1.2 microns by means of CVD.

Figure 1A:
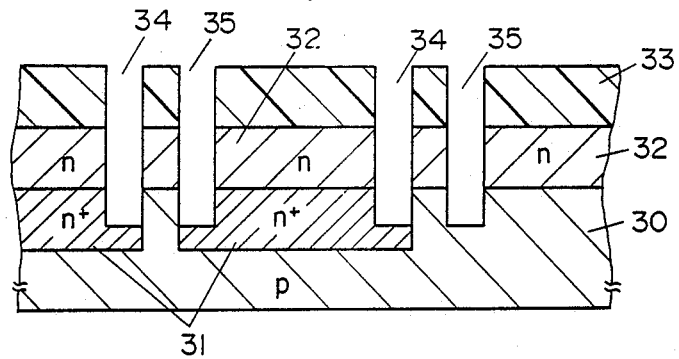
FIGS. 1A to 1G inclusive, show, sequentially, method steps for manufacturing a bi-polar LSI according to an embodiment of the present invention.
Figure 1B:
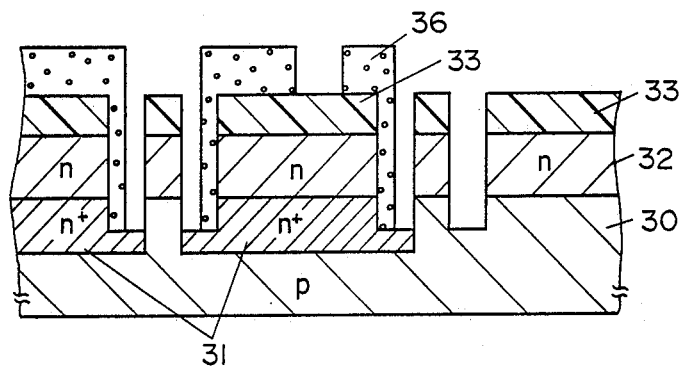

Portions of the CVD $SiO_2$ layer 33 at the deep isolation regions are removed by means of a photo-etching technique, and by using the remaining CVD $SiO_2$ layer 33 as a mask, 1.5 to 2.5 microns of the silicon is etched with a dry etching technique, leaving grooves 34 and 35 having a width of 0.8 to 1.2 microns (FIG. 1A).

Figure 1C:
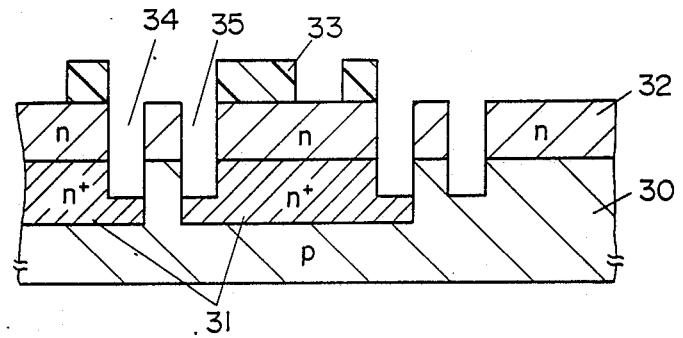

In the next step, by performing a photo-etching technique, a photoresist layer 36 is formed on the regions corresponding to the emitter, base and collector of said transistor (FIG. 1B), and by using the above-mentioned resist layer 36 as a mask, further portions of said CVD $SiO_2$ layer are etched off (FIG. 1C).

Part of the one micron epitaxial layer 32 is then etched off by means of a dry etching process in which said CVD $SiO_2$ layer 33 is used as a mask, and during this process, the depths of grooves 34 and 35 are increased by 1 micron, a shallow groove region 39 is defined surrounded by first and second deep grooves 37 and 38 having depths of 2.5 to 3.5 microns, respectively, the groove 39 having a depth of 1 micron for facilitating the collector isolation, and an indented region 41 is formed since the epitaxial layer 32 is removed from the field region.

Figure 1D:
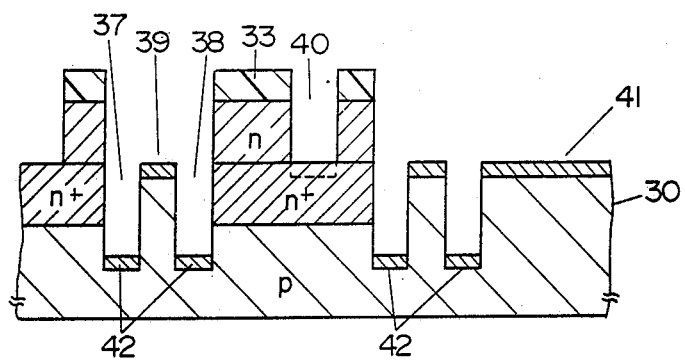

Subsequently, a channel stopper region 42 is formed on the regions defining the bottoms of the grooves and on the indented region by means of a 25 Kev, $1-10 \times 10^{13}$ ions/cm$^2$ boron ion implantation method in which said CVD $SiO_2$ layer 33 is used as a mask (FIG. 1D).

Figure 1E:
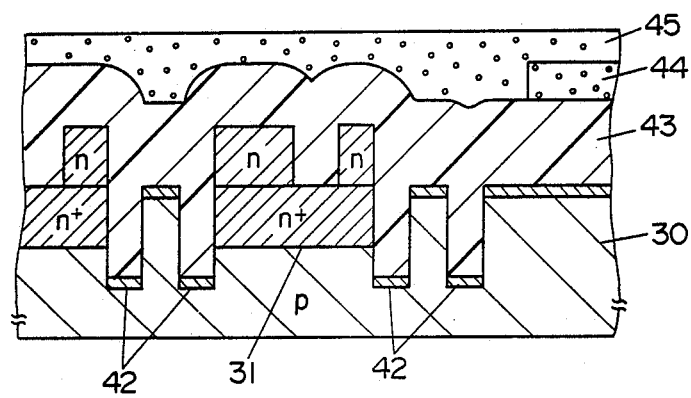

Said CVD $SiO_2$ layer 33 is then removed, and an $SiO_2$ layer 43 having a thickness of 1.4–1.8 microns which is greater than the depth of said shallow grooves is deposited by means of a decompressed CVD method using either $SiH_4$ or $SiH_2Cl_2$ and $N_2O$ gases on a thermal oxidation layer formed on the substrate over 0.03 microns. And, by means of a photolithographic method, a photoresist pattern 44 having a thickness of 1 micron is formed over said indented region 41. When the substrate is coated with a photoresist layer 45, a flat surface can be obtained (FIG. 1E).

Figure 1F:
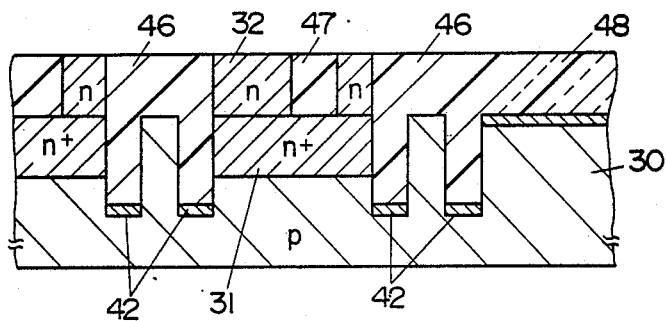
Figure 1G:
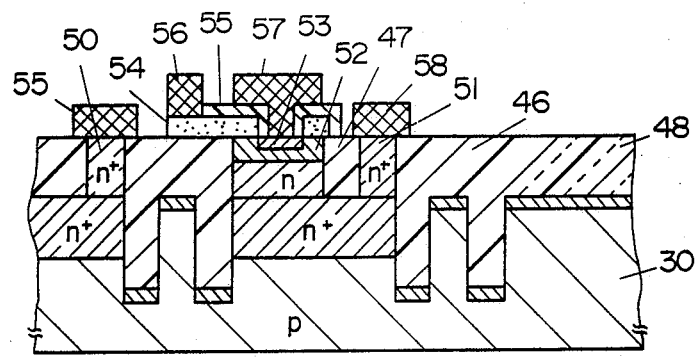

A dry etching process in which the etching speeds for the photoresist layers 44 and 45 and the $SiO_2$ layer 43 are identical is performed to level the upper surfaces of said epitaxial layer 32 and said $SiO_2$ layer 43. Accordingly, the grooves 37, 38, 39, 40 and the indentation region 41 remain occupied with said $SiO_2$ layer 43, and thus, the insulating isolation region 46 between the semiconductor elements, and the insulating layer 48 for the field are simultaneously formed (FIG. 1F).

Subsequently, n+ type collector regions 50 and 51, the base region 52, the emitter region 53, the p+ type polysilicon base electrode 54, the $SiO_2$ layer 55, and the aluminum electrodes 56, 57, 58, and 59 are then formed.

In the aforementioned steps, the regions at which the etching speed is higher than at other places, because of the narrow deep groove having a width of 0.8 to 1.2 microns, exist in the $SiO_2$ layer 46 which occupies the grooves 37, 38 and 39. In this case, since the first and the second deep grooves are contiguous with the shallow groove, the groove width y of the isolation region is 3 to 5 microns which is so wide that no regions at which the etching speed is high are defined thereover. Therefore, even in the process producing the transistor in FIG. 1G, no indented region should be formed even when the substrate is exposed to a liquid containing hydrofluoric acid.

And, since the isolation groove width y is relatively wide, the critical voltage at which the collectors 50 and 51 would be coupled through the depletion layer is relatively high and the depth of the groove can be relatively shallow and still prevent contact between the n+ type buried region 31 and the channel stopper 42.

And, since the side-walls of the base region 52 are in contact with both the SiO₂ layer 46 and the SiO₂ layer 47 for facilitating the base-collector isolation, the base-collector capacitance is small.

Furthermore, the field SiO₂ layer 48 is 1 micron thick which is relatively thick and this contributes to the parasitic capacitances of the wiring and the resistor body formed thereon being small. And, since the thick SiO₂ layers 46, 47 and 48 can be formed without exposing the substrate to a high temperature, the diffusion of arsenic in said buried layer 31 into said epitaxial layer 32 does not take place, and thus, the higher base-collector break through voltage can be achieved even with a relatively thin epitaxial layer 32. And, since the boron diffusion will not take place in the channel stopper region 42, and the high concentration boron will not contact the n+ buried region 31, there is no chance that the collector-substrate capacitance will increase.

Referring to FIG. 1E, if the substrate is subjected to a thermal treatment at 900° to 1000° C. in the oxidization gas or inert gas environment after the SiO₂ layer 43 formation or during the steps resulting in the formation of the device shown in FIG. 1F, the etching speed at which the SiO₂ layers 46, 47 and 48 occupying the grooves or the indented regions are etched with the hydrofluoric acid would be relatively low, and if the ratio of the width to the depth of the base-collector isolation groove is more than 1.5, a groove should not be formed on the indented region due to the higher etching speed at which the SiO₂ layer 47 is etched by the hydrofluoric acid.

Figure 2:
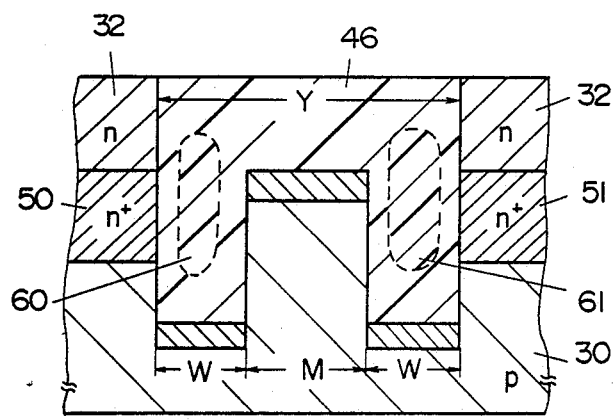
FIG. 2 shows a cross section of the isolation region of the above-mentioned LSI.

As shown by FIG. 2, if a wider groove width y is desired, the shallow groove can be made wider without making the SiO₂ layer 43 thicker, and the groove can be filled with the SiO₂ layer.

Referring now to FIGS. 3A to 3I inclusive, the second embodiment of this invention of a manufacturing method for an npn bi-polar transistor will be described below.

The present process begins with the formation of an n+ arsenic diffusion layer 131 having a depth of 1 micron by performing a selective diffusion technique on a p-type semiconductor substrate 30 having a resistance of 10 to 20 Ohms/cm, followed by the formation of an n+ epitaxial layer 132 having a resistance of 0.6 Ohms/cm, a thickness of 1 micron, and on which a 0.1 micron thick Si₃N₄ layer 133 and a 1.2 micron thick SiO₂ layer 134 are formed.

Figure 3A:
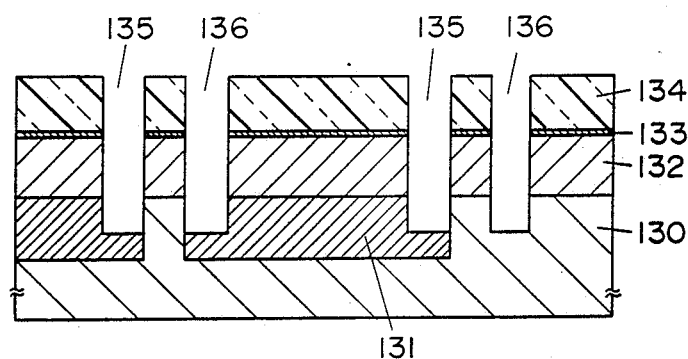
FIGS. 3A to 3I inclusive, show, sequentially, method steps for manufacturing an npn type bi-polar transistor according to another embodiment of the present invention.

By means of a photo-etching technique, the CVD SiO₂ layer 134 and the Si₃N₄ layer 133 are removed from the areas corresponding to the deep isolation regions, and by using the CVD SiO₂ layer 134 and the Si₃N₄ layer 133 as masks, the epitaxial layer 132 and the semiconductor substrate 130 are etched off to a depth of 1.5 to 2.5 microns by a dry etching technique, leaving grooves 135 and 136 having a width of 0.8 to 1.2 microns thereon (FIG. 3A).

Figure 3B:
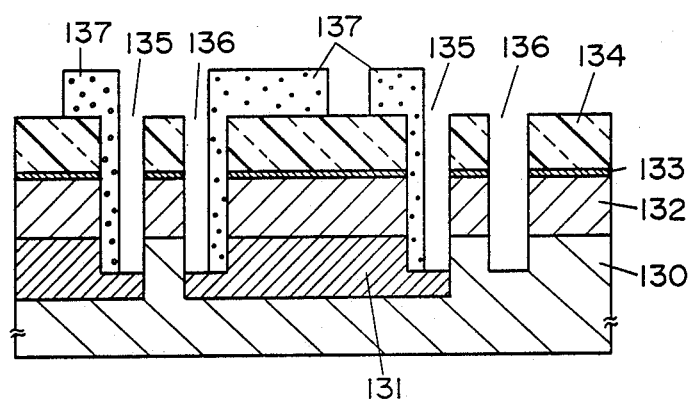

Photoresist layers 137 are then photolithographically formed on the regions corresponding to the emitter, base and collector of the transistor (FIG. 3B).

Figure 3C:
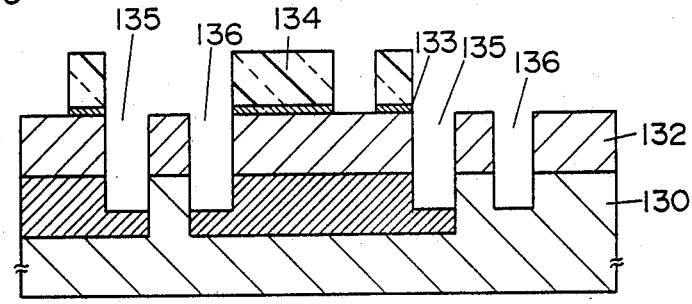

By using said photoresist layer 137 as a mask, portions of the CVD SiO₂ layer 134 and the Si₃N₄ layer 133 are removed, and after that, said photoresist layer 137 is removed (FIG. 3C).

Figure 3D:
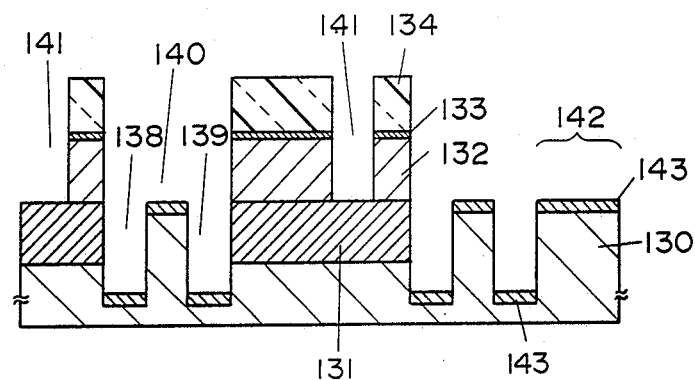

The exposed surface is then etched by the amount of 1 micron which corresponds to the thickness of said epitaxial layer 132 by using said CVD SiO₂ layer 134 as a mask, and accordingly, the depths of said grooves 138 and 139 are increased until the first deep groove 138 and the second deep groove 139 have depths of 2.5 to 3.5 microns. At the same time, a shallow groove 140 having a depth of 1 micron which is surrounded by said grooves 138 and 139, a groove 141 having a depth of 1 micron for the base-collector isolation, and an indented region 142 which is formed by removing the epitaxial layer 132 from the field region, are formed simultaneously. A channel stopper diffusion layer 143 is formed by performing a boron ion implantation of 25 kev, 1 10×10¹³ ions/cm and in which said CVD SiO₂ layer 134 is used as a mask (FIG. 3D).

Figure 3E:
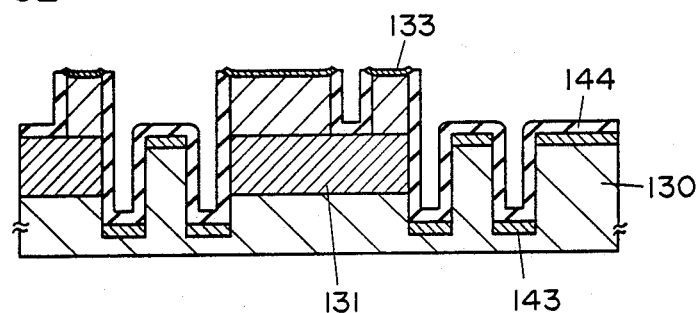

After said CVD SiO₂ layer 134 is removed, the anti-oxidation Si₃N₄ layer 133 is used as a selective oxidation mask, and then a SiO₂ layer 144 having a thickness of 0.1 to 0.2 micron is formed on the surface defining the grooves and the indented region by means of a high pressure oxidation method performed at 800° C. (FIG. 3E).

Figure 3F:
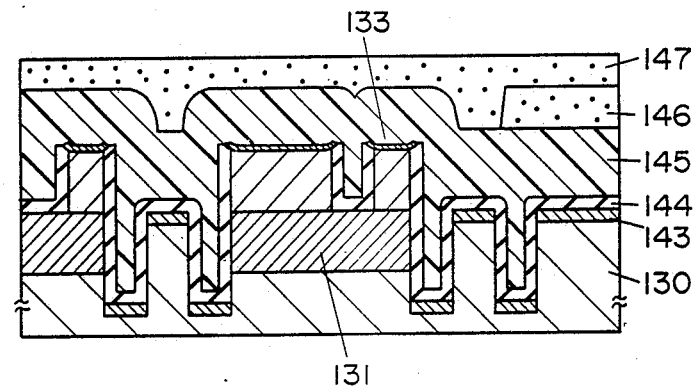

Then, a SiO₂ layer 145 having a thickness of 1.4 to 1.8 microns which is larger than the depth of said shallow groove 140 is deposited by means of a decompressed CVD method, and then a photoresist pattern 146 having a thickness of 1 micron is formed on the indented region 142 by means of photolithography. A flat surface can be obtained when the entire surface is coated with a photoresist layer 147 (FIG. 3F).

Figure 3G:
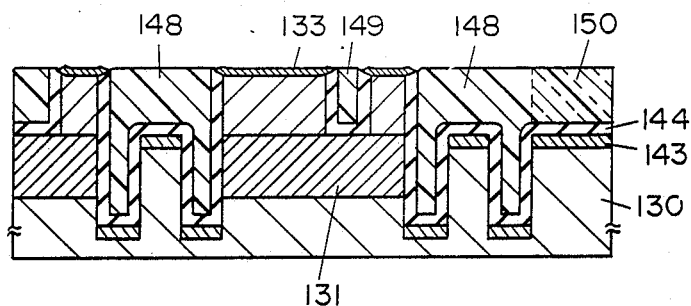

By means of a dry-etching technique, in which the etching speeds at which said photoresist layers 146 and 147 and the CVD SiO₂ layer 145 are etched are nearly identical, an etching process is conducted until the upper surfaces of said Si₃N₄ layer 133 and the said CVD SiO₂ layer 145 are leveled, and by this, said CVD SiO₂ layer 145 is buried in grooves 138, 139, 140, and 141, and at the indentation region 142. Thus, the SiO₂ layer 148, the base-collector isolation SiO₂ layer 149, and the SiO₂ layer 150 for the field are simultaneously formed (FIG. 3G).

Figure 3H:
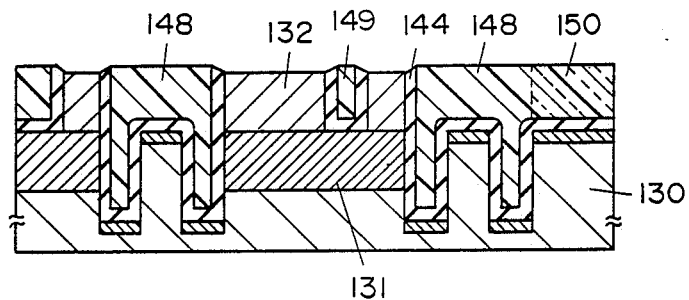

The Si₃N₄ layer 133 is removed in the next step, and because of this, the exposed surfaces of the SiO₂ layer 144 and the SiO₂ layers 148, 149 and 150 become higher than the exposed surface of said epitaxial layer 132. By providing this kind of structure, the side-walls of the semiconductor substrate in the isolation regions should never be exposed by the subsequent processes (FIG. 3H).

Figure 3I:
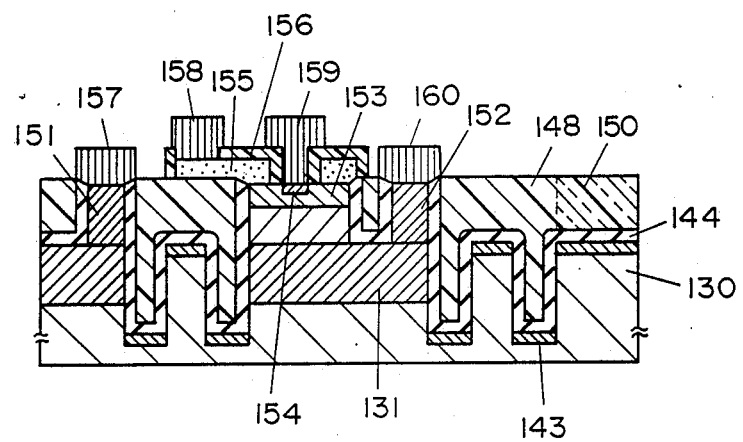

By forming the n+ collector diffusion layers 151 and 152, the p+ base diffusion layer 153, the n+ emitter diffusion layer 154, the p+ type poly-silicon base electrode 155, the SiO₂ layer 156, and the aluminum electrodes 157, 158, 159, and 160, the npn-type bipolar transistor illustrated in FIG. 3I is completed.

Figure 4:
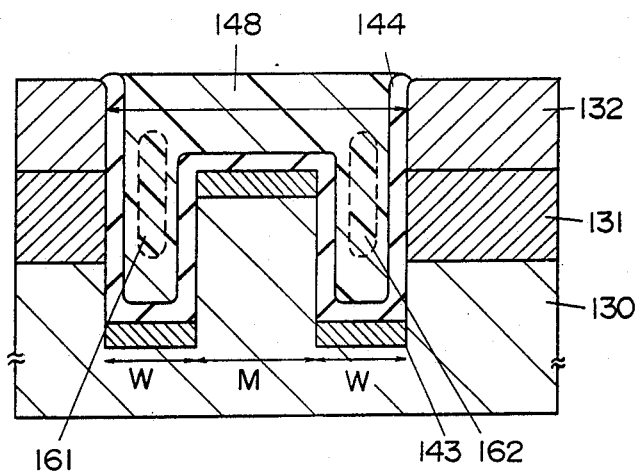
FIG. 4 shows a cross section of the isolation region of the above-mentioned transistor.

In the method described above, at regions 161 and 162 which are defined on the SiO₂ layer 148 which is buried in the grooves 138, 139, and 140, the etching speed would tend to be higher because the width of said deep grooves is narrow, e.g. 0.8 to 1.2 microns as shown in FIG. 4. However, since the first and second deep grooves and the shallow groove are contiguous, and the isolation groove is relatively wide, e.g. 3 to 5 microns, a higher etching speed region is not formed on the surface of said SiO₂ layer 148. And furthermore, the exposed surfaces of SiO₂ layers 144 and 148 are disposed higher, by an amount which corresponds to the thickness of Si₃N₄ layer 133, than the exposed surface of the epitaxial layer 132, and therefore, in the process in which the transistor is formed as illustrated in FIG. 3I, no indented region would be formed even if it is subjected to the etching process employing liquid containing the hydrofluoric acid.

Since the SiO$_2$ layer 144 is formed on the surface defining the isolation groove, the SiO$_2$ layer improves the isolation region by preventing leakage through the junction and by increasing the insulation breakage voltage.

Figure 5A:
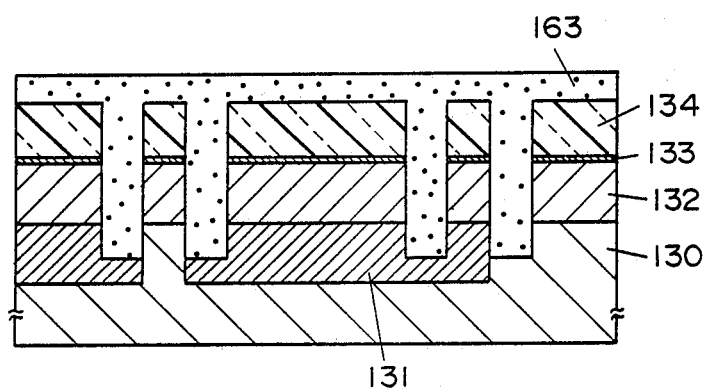
FIGS. 5A and 5B show other method steps for forming said isolation region.
Figure 5B:
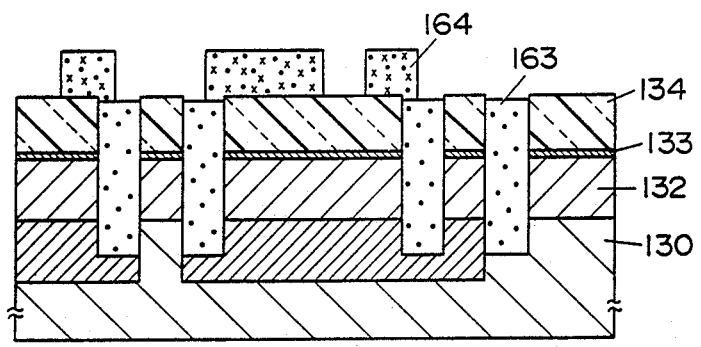
Figure 6A:
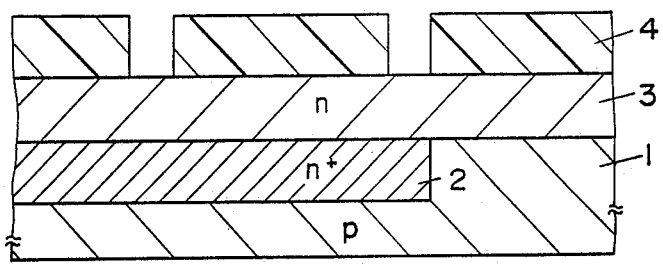
FIGS. 6A to 6F inclusive, show a conventional manufacturing method of an npn bi-polar transistor.
Figure 6B:
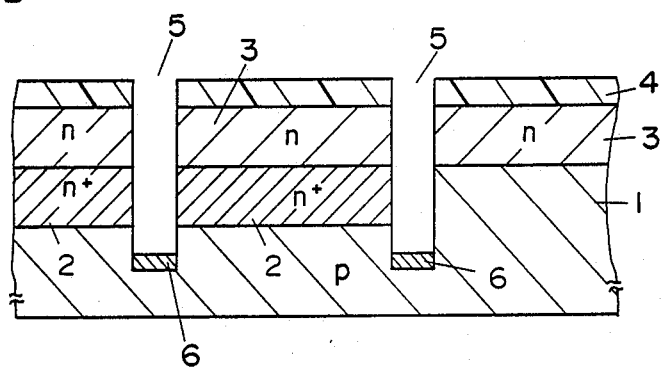
Figure 6C:
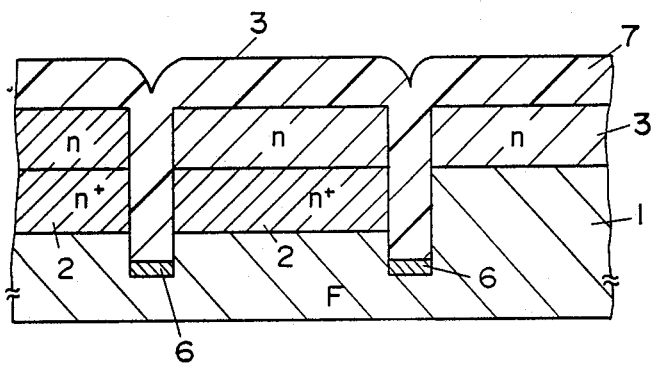
Figure 6D:
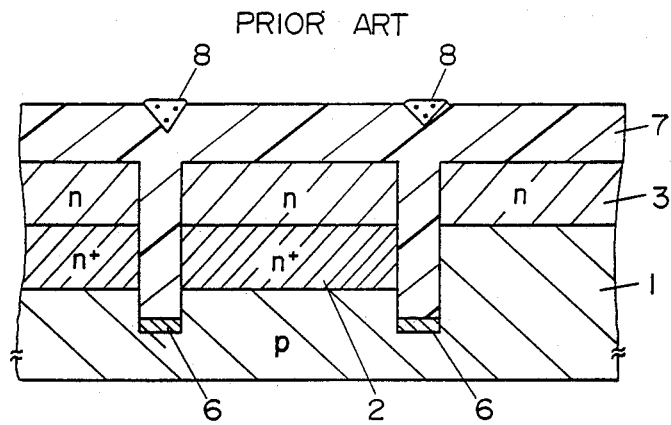
Figure 6E:
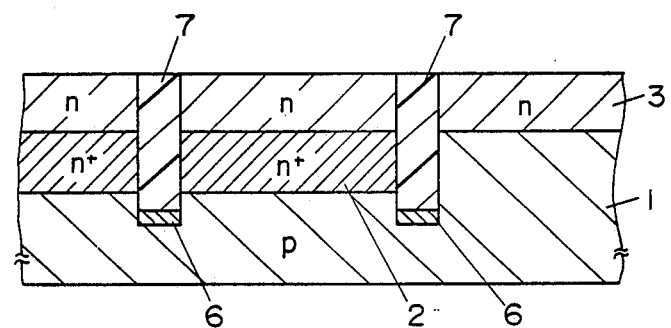
Figure 6F:
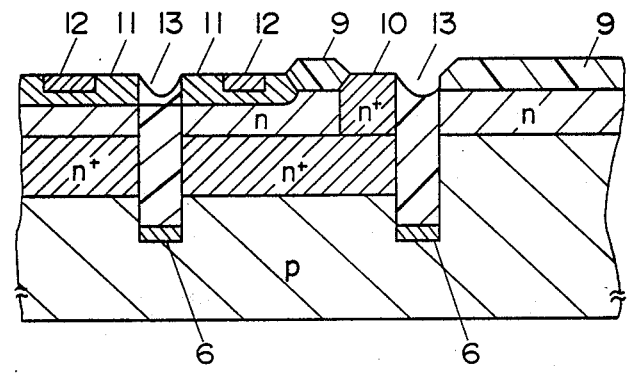
Figure 7A:
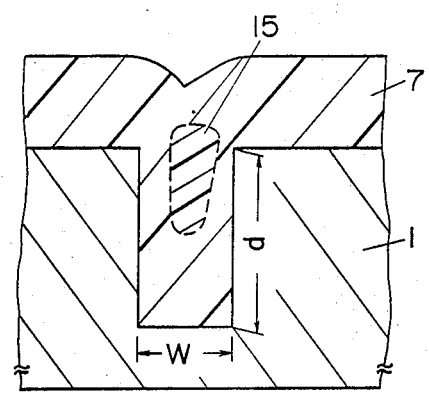
FIGS. 7A and 7B show the cross sections of the isolation region obtained by employing the conventional method.
Figure 7B:
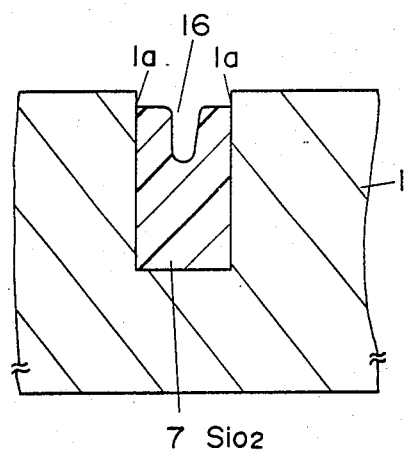
Figure 8:
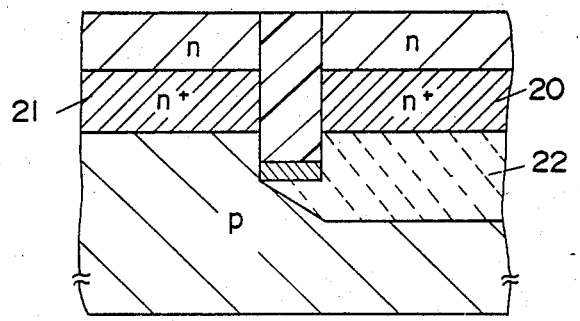
FIG. 8 shows a cross section of the prior art transistor at a portion at which voltage is applied between collectors disposed adjacent the conventionally formed isolation regions.

In the method step shown in FIG. 3B, the photoresist pattern 137 is directly formed after the grooves 135 and 136 are formed, but an alternative method step can be performed in which a portion of a photoresist layer 163 can remain in the groove areas 135 and 136 by performing a dry etching technique after the photoresist layer is formed on the entire surface as shown by FIG. 5A. Then, a photoresist pattern 164 can be formed as illustrated in FIG. 5B. A highly precise pattern can be obtained by employing this method.

Furthermore, by subjecting the substrate to a thermal treatment in an oxidation gas or an inert gas environment at 900° to 1000° C. after the SiO$_2$ layer 145 is formed or after the flat surface is formed as shown in FIG. 3G, the etching speed at which said SiO$_2$ layers 148, 149 and 150 are etched with the hydrofluoric acid can be lowered.

While specific embodiments of the invention have been illustrated and described herein, it is to be understood that other modifications and changes will become apparent to those skilled in the art. It is therefore to be understood that the appended claims are intended to cover all modifications and changes as fall within the true spirit and scope of the invention.

What we claim is:

1. In a semiconductor integrated circuit device including a semiconductor substrate, the improvement comprising:

the semiconductor substrate having a first groove extending therein, a second groove extending therein adjacent said first groove, and a shallow groove extending between and open to said first and said second grooves, each of said first and said second grooves extending in said semiconductor substrate to a depth that is greater than the depth to which said shallow groove extends in said semiconductor substrate, and said first and said second grooves and said shallow groove collectively defining an isolation groove;

an integral mass of insulative material disposed in said first and said second grooves and in said shallow groove defining said isolation groove; and a channel stopper region defined in said substrate beneath said insulative material at respective portions of the substrate that define the bottom of said first and second grooves and the bottom of said shallow groove.

2. An improvement in a semiconductor integrated circuit device as claimed in claim 1, wherein said semiconductor substrate includes a silicon base, an n+ type region defined in an upper portion of said base, and an epitaxial layer disposed over the upper portion of said silicon base, the bottom of said first and said second grooves each located within said base, and the bottom of said shallow groove located in a plane extending along the junction between said n+ type region and said epitaxial layer.

3. An improvement in a semiconductor integrated circuit device as claimed in claim 2, wherein said epitaxial layer defines base, collector and emitter regions of a transistor, the base and collector regions disposed on opposite sides of said mass of insulative material from one another, and further comprising respective electrodes electrically connected to said base, said collector and said emitter regions.

4. An improvement in a semiconductor integrated circuit device as claimed in claim 1, wherein said semiconductor substrate includes a silicon base, an n+ type region defined in an upper portion of said base, an epitaxial layer disposed over the upper portion of said silicon base, and an SiO$_2$ diffusion layer extending in said isolation groove beneath said mass of insulative material, said mass of insulative material and said epitaxial layer having respective upper surfaces disposed opposite said base, and the upper surface of said mass of insulative material laying in a plane that is spaced further from said n+ type region than is a plane in which the upper surface of said epitaxial layer lies.

5. An improvement in a semiconductor integrated circuit device as claimed in claim 4, wherein said epitaxial layer defines base, collector and emitter regions of a transistor, the base and collector regions disposed on opposite sides of said mass of insulative material from one another with said diffusion layer extending therebetween, and further comprising respective electrodes electrically connected to said base, said collector and said emitter regions.

* * * * *